United States Patent
Grigg et al.

(10) Patent No.: US 6,379,991 B2
(45) Date of Patent: *Apr. 30, 2002

(54) ENCAPSULATION METHODS FOR SEMICONDUCTIVE DIE PACKAGES

(75) Inventors: Ford B. Grigg, Meridian; Joseph M. Brand, Boise, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/360,785

(22) Filed: Jul. 26, 1999

(51) Int. Cl.$^7$ .............................................. H01L 21/00
(52) U.S. Cl. .................... 438/65; 264/494; 430/311; 430/321; 438/4; 438/26; 438/64
(58) Field of Search ................................ 438/4, 22, 26, 438/55, 65, 25–29, 64; 430/311, 321; 264/494

(56) References Cited

U.S. PATENT DOCUMENTS

| | | | | |
|---|---|---|---|---|
| 4,635,356 A | * | 1/1987 | Ohuchi et al. ................. 29/841 |
| 4,843,036 A | * | 6/1989 | Schmidt et al. ................. 438/64 |
| 4,961,886 A | * | 10/1990 | Eckstein et al. ............. 264/494 |
| 5,219,712 A | * | 6/1993 | Evans et al. ................. 430/311 |
| 5,302,778 A | * | 4/1994 | Maurinus .................... 174/52.4 |
| 5,364,744 A | * | 11/1994 | Buican et al. ............... 430/321 |
| 5,399,637 A | * | 3/1995 | Willett et al. ................ 526/142 |
| 5,415,543 A | * | 5/1995 | Rozmajzl, Jr. ................ 433/29 |
| 5,728,251 A | * | 3/1998 | Check, III ................ 156/307.5 |
| 5,939,775 A | * | 8/1999 | Bucci et al. ................. 257/667 |
| 5,953,130 A | * | 9/1999 | Benedict et al. ............ 356/429 |
| 6,054,754 A | * | 4/2000 | Bissey ......................... 257/666 |

FOREIGN PATENT DOCUMENTS

DE 19640006 A1 * 4/1998

* cited by examiner

Primary Examiner—Charles Bowers
Assistant Examiner—Asok Kumar Sarkar
(74) Attorney, Agent, or Firm—Wells, St. John, Roberts Gregory & Matkin, P.S.

(57) ABSTRACT

The invention includes a semiconductor processing method of forming a die package. An insulative substrate is provided. Circuitry is over a topside of the substrate, and a slit extends through the substrate. A semiconductive-material-comprising die is provided beneath the substrate, and has a surface exposed through the slit in the substrate. The die has an edge. There is a gap between the die and an underside of the substrate. A radiation-curable material is injected through this slit and into the gap. Radiation is directed from over the edge to the gap to cure at least a portion of the radiation-curable material within the gap and thus form a dam which impedes non-cured radiation-curable material from flowing beyond the edge.

40 Claims, 10 Drawing Sheets

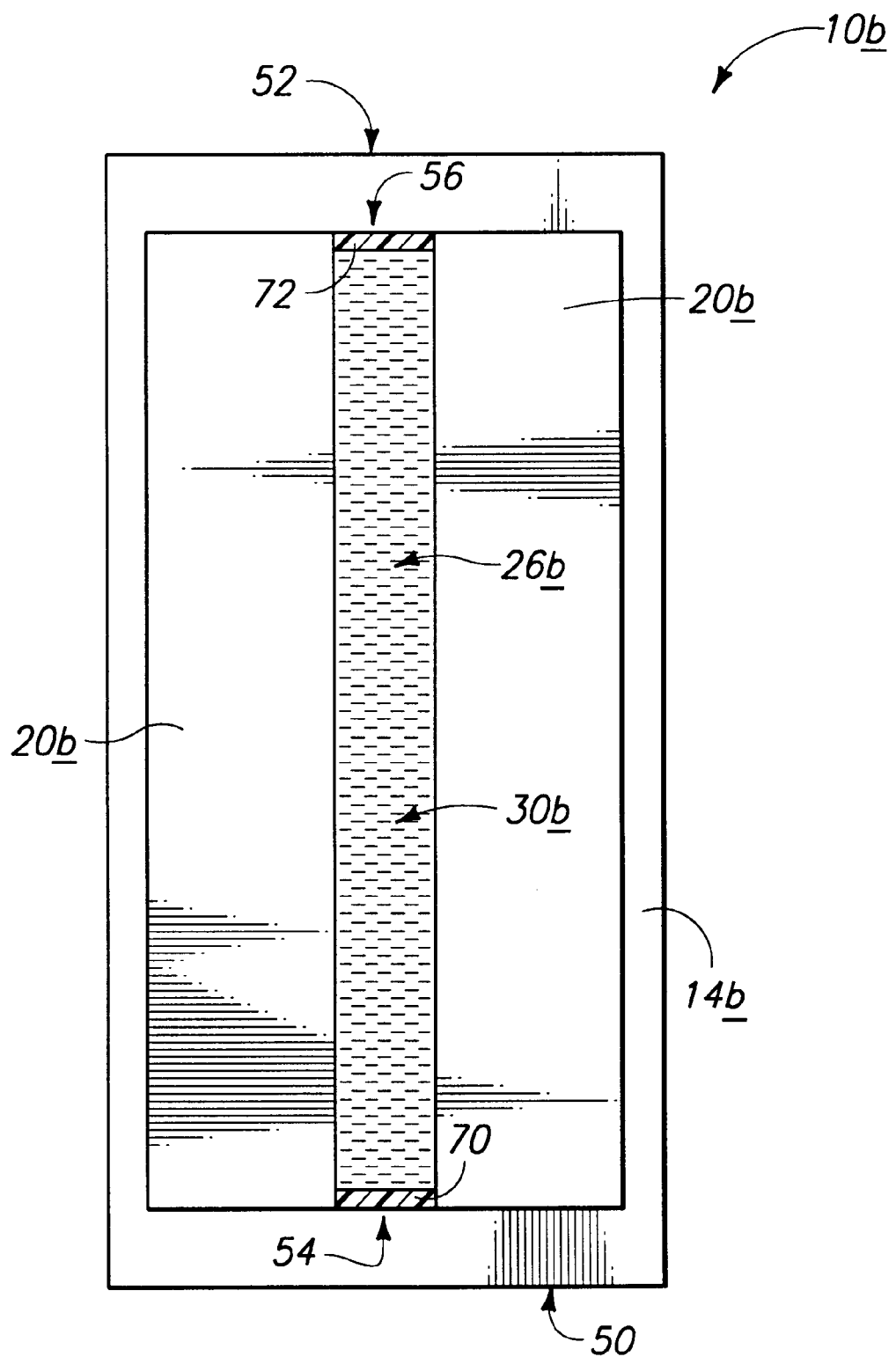

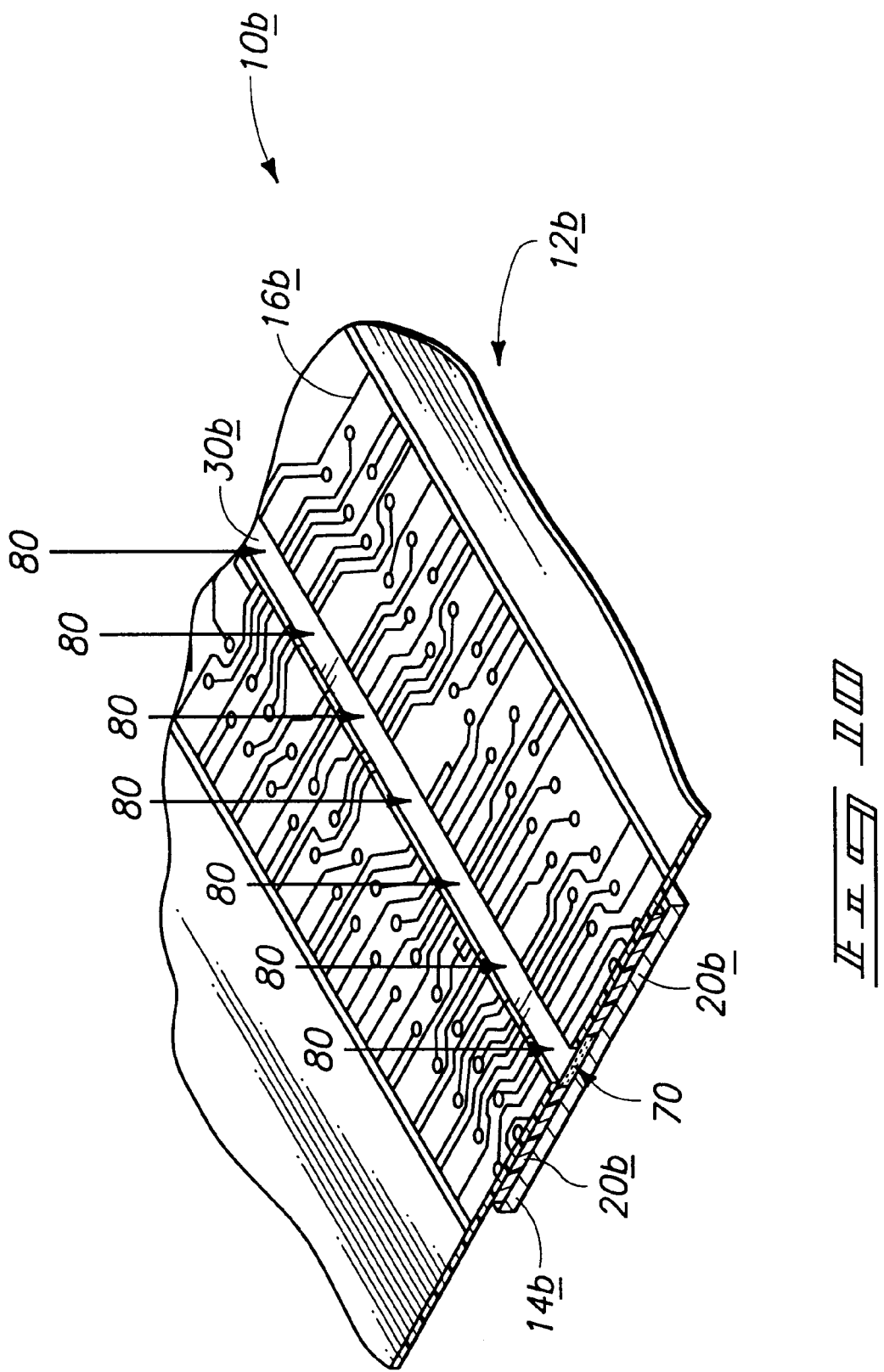

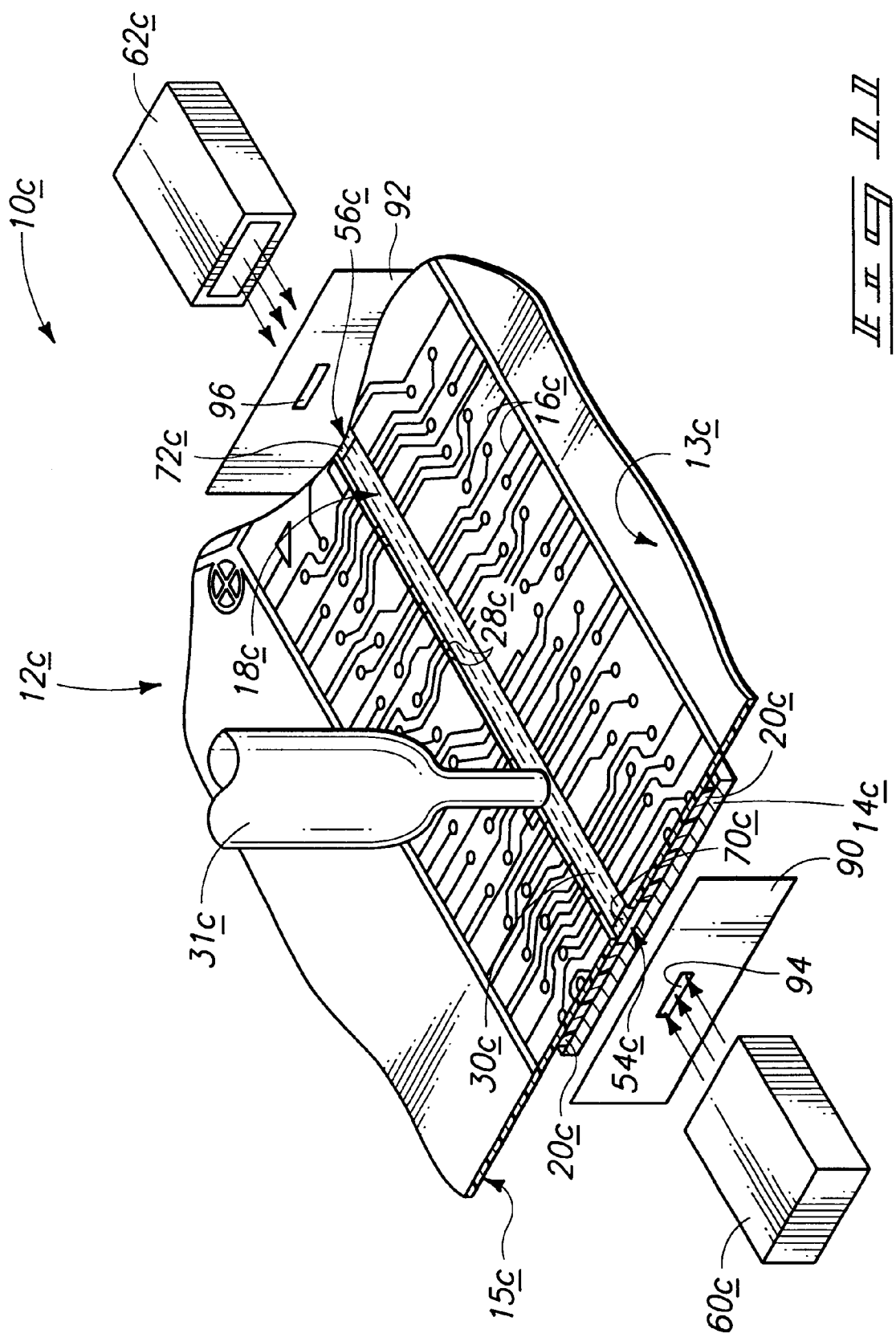

US 6,379,991 B2

ENCAPSULATION METHODS FOR SEMICONDUCTIVE DIE PACKAGES

TECHNICAL FIELD

The invention pertains to methods of forming encapsulant over semiconductor dies, such as, for example, methods of forming die packages.

BACKGROUND OF THE INVENTION

A prior art method of forming a die package is described with reference to FIGS. 1–7. Referring first to FIG. 1, such illustrates a fragment of an assembly 10 comprising an insulative material substrate 12. Insulative substrate 12 comprises a top surface 13 and slits 18 extending therethrough. Circuitry 16 is formed on top surface 13. Circuitry 16 and slits 18 form repeating patterns across top surface 13. The repeating patterns define separate units 19, 21 and 23, each of which ultimately forms a separate die package.

Referring to FIGS. 2–4, an enlarged segment of substrate 12, corresponding to unit 21, is shown in three different views. FIG. 2 is a top view similar to the view of FIG. 1, FIG. 3 is an end view, and FIG. 4 is a cross-sectional top view along the line 4—4 of FIG. 3.

Substrate 12 comprises a bottom surface 15. A semiconductive-material-comprising die (or chip) 14 is adhered to bottom surface 15 via a pair of adhesive strips 20. Strips 20 can comprise, for example, tape having a pair of opposing surfaces 22 and 24, with adhesive being provided on both of such opposing surfaces. Adhesive strips 20 space die 14 from insulative substrate 12, and accordingly form a gap 26 between die 14 and insulative material 12. Strips 20 can accordingly be considered spacers. Gap 26 is in the form of a channel that extends from one end of strips 20 to another end of strips 20. Preferably, strips 20 comprise insulative material such that strips 20 do not form an electrical connection between die 14 and conductive circuitry associated with substrate 12.

Wire bonds 28 (only some of which are labeled in FIG. 2) extend from circuitry 16, through slit 18 and gap 26, to electrically connect circuitry 16 to bonding pads 25 (only some of which are labeled in FIG. 2) associated with die 14, and to accordingly electrically connect circuitry 16 with circuitry (not shown) comprised by die 14. (The wire bonds and bonding pads are not shown in FIGS. 3 and 4 for purposes of clarity in the illustrations.)

After wire bonds 28 are formed, an encapsulant is provided over wire bonds 28 to protect such wire bonds. A method of providing the encapsulant is described with reference to FIGS. 5 and 6. Referring to FIG. 5, the die assembly of FIG. 4 is shown at an initial stage of the encapsulant-forming methodology. Specifically, dams 27 and 29 are formed at ends of gap 26. Such dams can be formed by, for example, dispensing and curing liquid encapsulant at the die sides.

Referring to FIG. 6, an encapsulant 30 is provided through slit 18 after dams 27 and 29 (FIG. 5) are formed. Specifically, an injector 31 is provided over slit 18 and utilized to inject encapsulant 30 through slit 18 and into gap 26 to substantially fill gap 26 and slit 18. By "substantially fill" it is meant that the encapsulant fills more than half of the combined space of gap 26 and slit 18. In particular applications, the encapsulant can completely fill gap 26 and slit 18. The encapsulant utilized is generally a heat curable epoxy. Accordingly, the encapsulant is provided within gap 26 as a liquid, and subsequently subjected to heat to cure the encapsulant into a more solid form.

After encapsulant 30 is provided and cured, circuitry 16 and die 14 can be subjected to additional package-forming steps. For instance, FIG. 7 illustrates a portion of substrate 12 (specifically, a portion comprising units 19 and 21) at a step subsequent to curing of encapsulant 30. Conductive balls 31 (only some of which are labeled) have been formed over portions of circuitry 16 to form a ball grid array which can be subsequently utilized to form a plurality of interconnects from circuitry 16 to other circuitry (not shown).

FIG. 7 further illustrates that substrate 12 can be subjected to a singulation process to separate units 19 and 21 from one another, and thus form individual die packages from units 19 and 21.

It would be desirable to develop alternative methods of forming semiconductive die packages. It would be particularly desirable to develop alternative methods of providing encapsulant over wire bonds associated with semiconductive die packages.

SUMMARY OF THE INVENTION

In one aspect, the invention encompasses a semiconductor processing method. An insulative substrate is provided. Such substrate has a pair of opposing surfaces and an opening extending therethrough. The opening extends from one of the opposing surfaces to another of the opposing surfaces. A semiconductor-material-comprising die is provided adjacent to said one of the opposing surfaces of the insulative substrate, and the die has an edge. A gap is between the die and insulative substrate, and exposed through the opening. A liquid radiation-curable material is flowed through the opening and into the gap. Radiation is directed from beside the die to cure at least a portion of the radiation-curable material within the gap and thus form a dam which impedes non-cured radiation-curable material from flowing beyond the edge.

In another aspect, the invention encompasses a method of forming a die package. An insulative substrate is provided, and such substrate has an underside and an opposing topside. Circuitry is over the topside of the insulative substrate, and a slit extends through the insulative substrate. A semiconductive-material-comprising die is provided beneath the underside of the insulative substrate, and has a surface exposed through the slit in the insulative substrate. The die has an edge. There is a gap between the die and the underside of the insulative substrate. A radiation-curable material is injected through this slit and into the gap. Radiation is directed from over the edge to the gap to cure at least a portion of the radiation-curable material within the gap and thus form a dam which impedes non-cured radiation-curable material from flowing beyond the edge.

BRIEF DESCRIPTION OF THE DRAWINGS

Preferred embodiments of the invention are described below with reference to the following accompanying drawings.

FIG. 9 is a cross-sectional top view of the fragment of FIG. 8, and shown in a view corresponding to that of FIG. 4.

FIG. 10 is a fragmentary, perspective view of the assembly of FIG. 8 shown at a processing step subsequent to that of FIGS. 8 and 9, and shown in a view corresponding to that of FIG. 8.

FIG. 11 is a fragmentary, perspective view of an assembly similar to that described in reference to FIGS. 2–4, and shown at a second embodiment processing step of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In particular aspects, the invention encompasses improved methods for providing encapsulant over wire bonds during semiconductor package fabrication. The invention describes specific embodiments with reference to such aspect. However, it is to be understood that the invention also pertains to other methodologies wherein encapsulant is provided and cured. For instance, encapsulant can be provided in applications wherein no wire bonds are present, and wherein it is utilized to simply protect a covered surface.

A first embodiment of the invention is described with reference to FIGS. 8–10. In describing such embodiment, similar numbering will be utilized as was used above in describing the prior art processing with reference to FIGS. 1–7, with the suffix "a" utilized to indicate structures of FIGS. 8–10.

Figure 8:
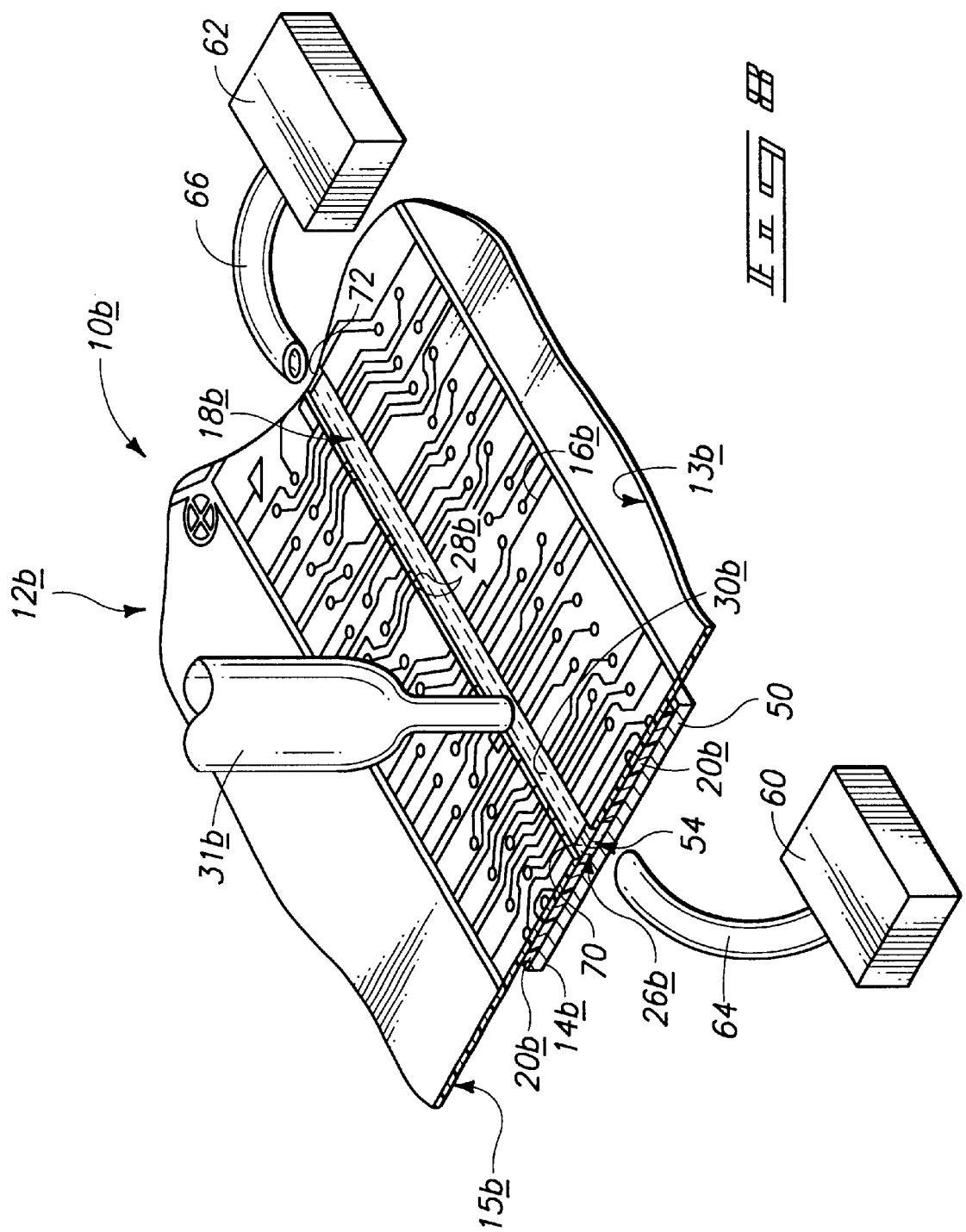
FIG. 8 is a fragmentary, perspective view of an assembly similar to the type described in reference to prior art FIGS. 2–4, shown at a processing step subsequent to that of FIG. 2 and in accordance with a first embodiment method of the present invention.

Referring to FIGS. 8 and 9, a semiconductor assembly 10 comprises an insulative substrate 12b having a top surface 13b and a lower surface 15b. Circuitry 16b is provided on upper surface 13b, and a slit 18b extends through substrate 12b. A semiconductive-material-comprising die 14b is provided beneath lower surface 15b. Semiconductive-material-comprising die can comprise, for example, monocrystalline silicon and can have integrated circuitry formed therein, thereon, and otherwise associated therewith. Die 14b is adhered to substrate 12b through a pair of adhesive strips 20b. Strips 20b can, as discussed above with reference to the prior art, comprise tape having adhesive applied to a pair of opposing surfaces. Strips 20b space die 14b from insulative material 12b and accordingly define a gap 26b extending elevationally between die 14b and insulative material 12b. Gap 26b extends laterally between strips 20b, and comprises ends 54 and 56 (FIG. 9) coextensive with ends of strips 20b.

Slit 18b extends entirely through material 12b, and accordingly extends from surface 13b to surface 15b. Slit 18b defines an opening through which gap 26b is exposed.

Figure 1:
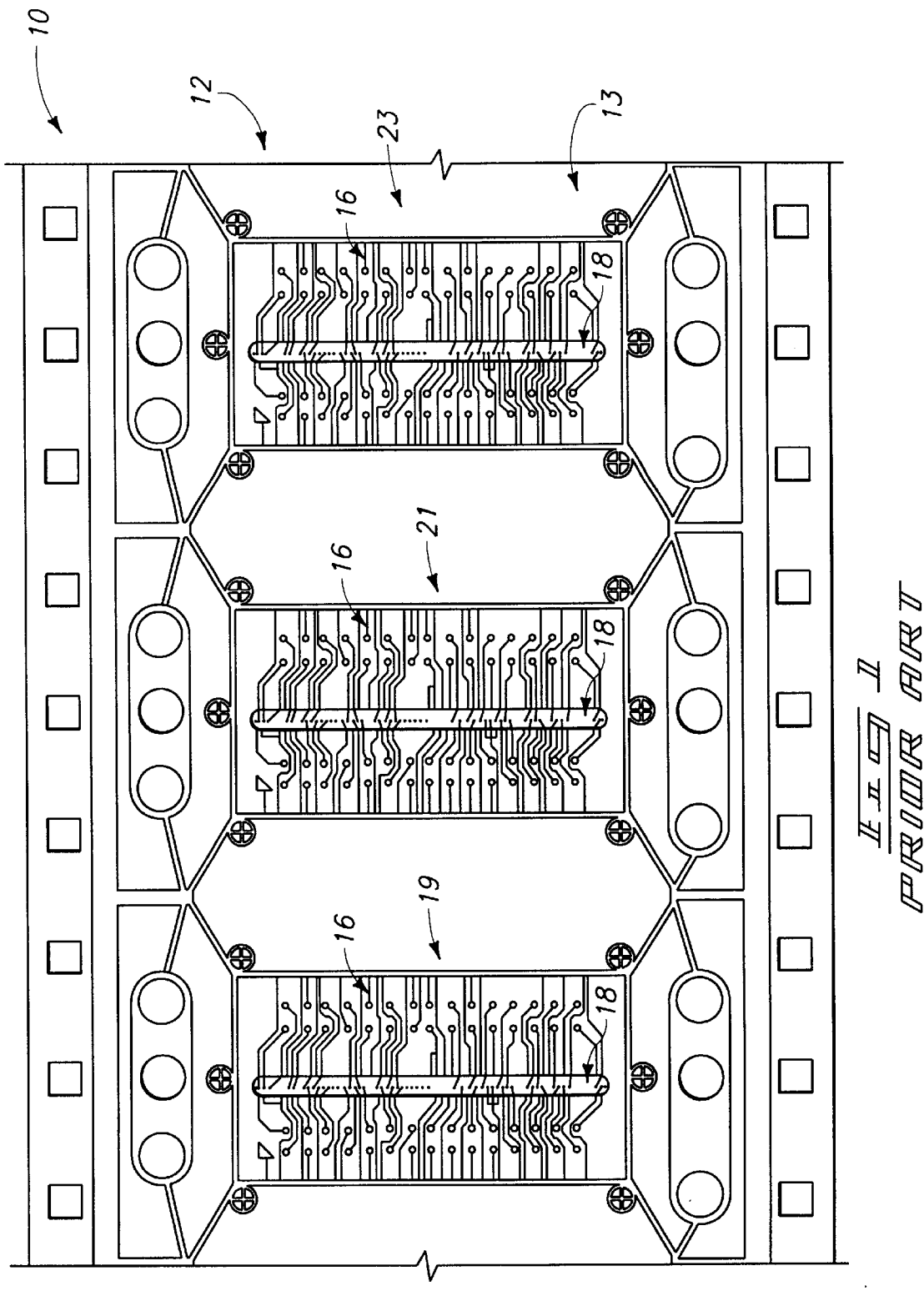
FIG. 1 is a diagrammatic, fragmentary top view of a prior art semiconductor assembly at a preliminary step of a die package forming process.
Figure 2:
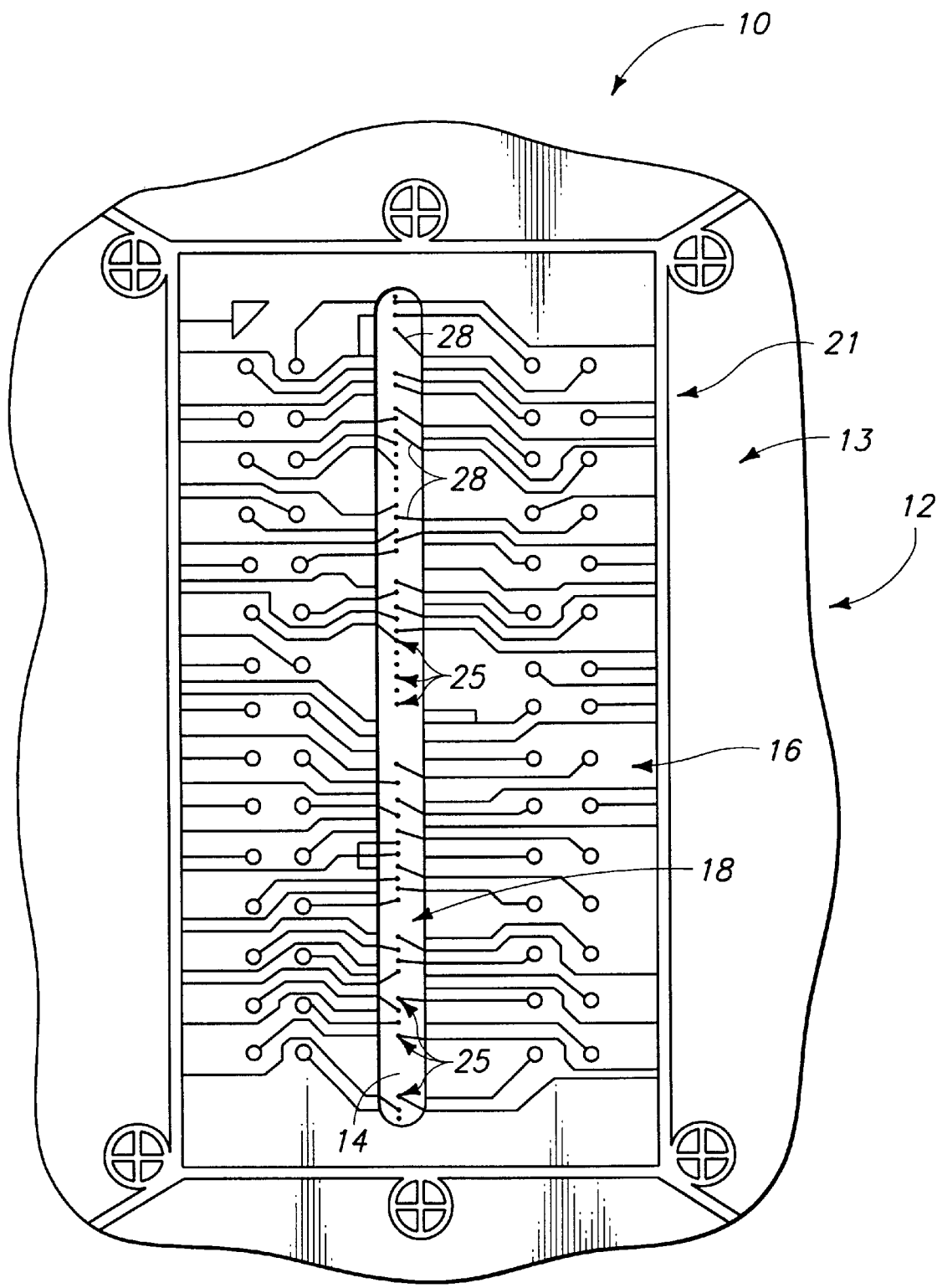
FIG. 2 is an expanded view of a portion of the FIG. 1 assembly.
Figure 3:
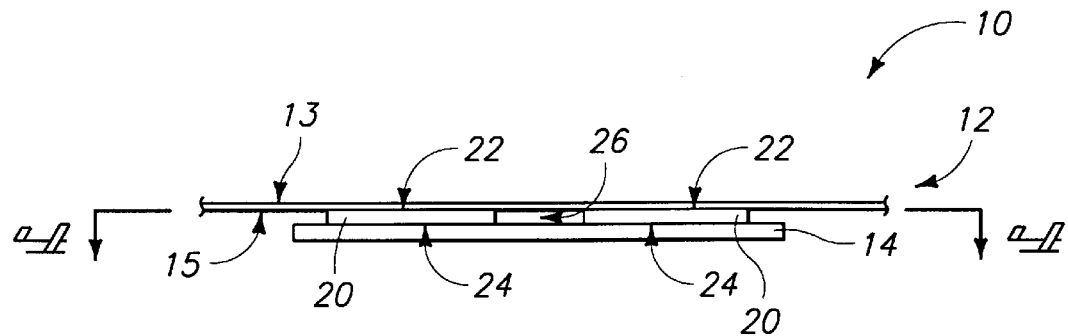
FIG. 3 is an end view of the FIG. 2 portion.
Figure 4:
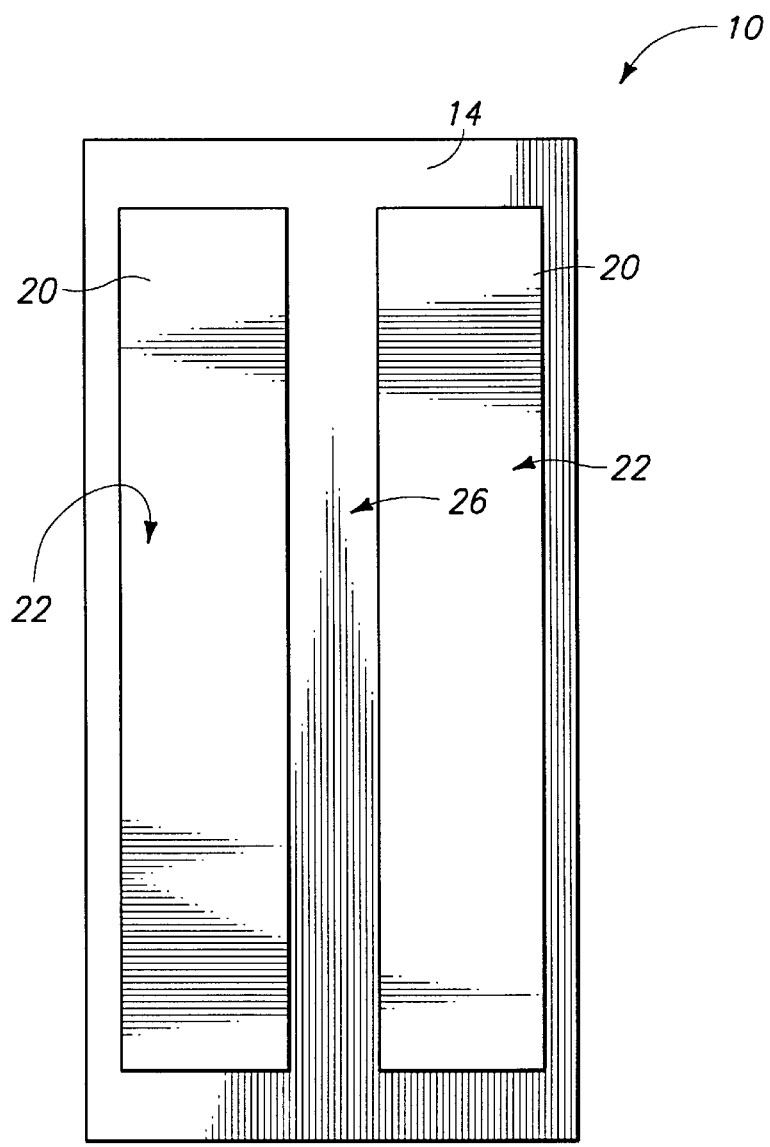
FIG. 4 is a cross-sectional top view along the line 4—4 of FIG. 3.
Figure 5:
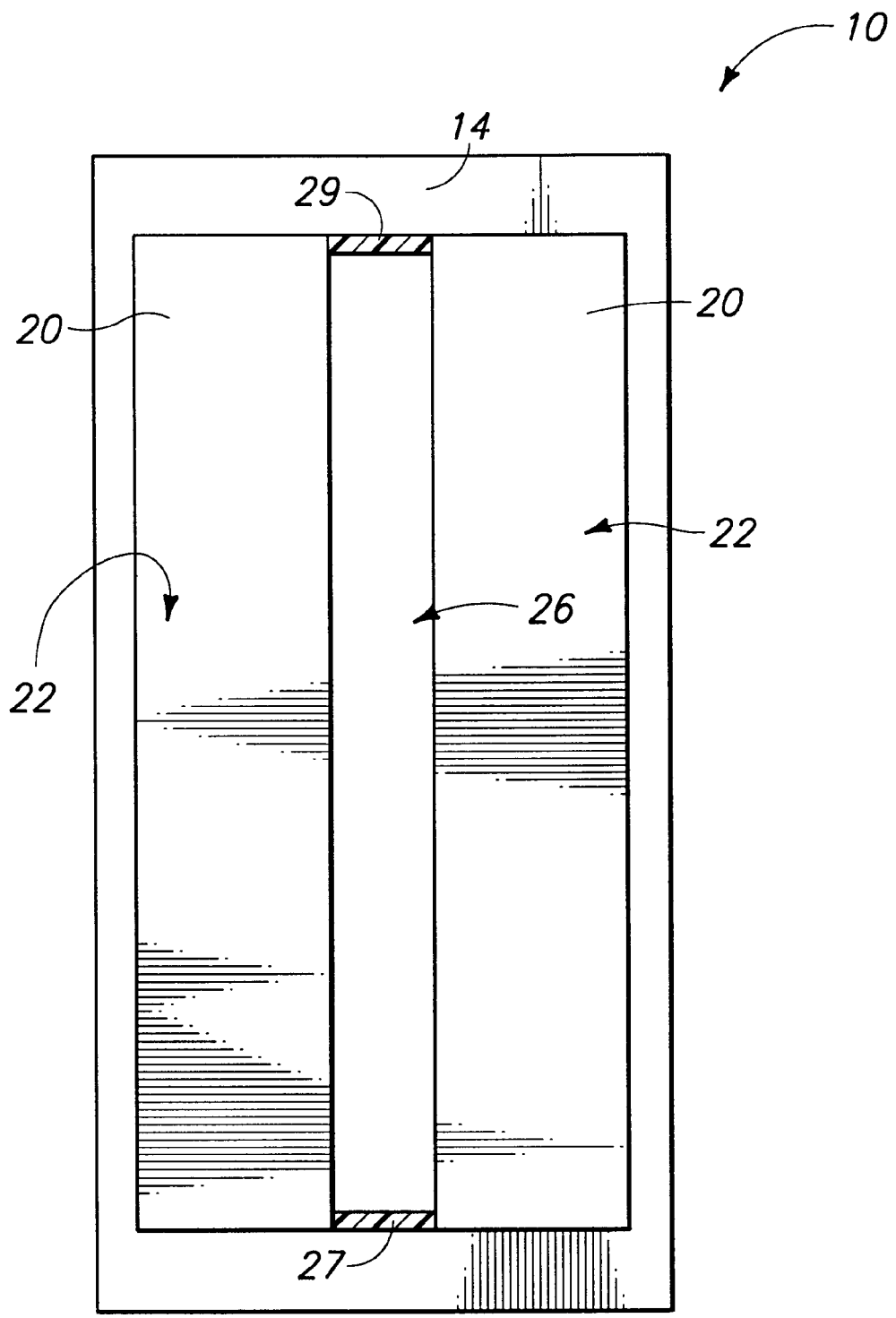
FIG. 5 is a view of the assembly of FIGS. 2–4, shown at a prior art processing step subsequent to that of FIGS. 2–4, and shown in a view corresponding to that of FIG. 4.
Figure 6:
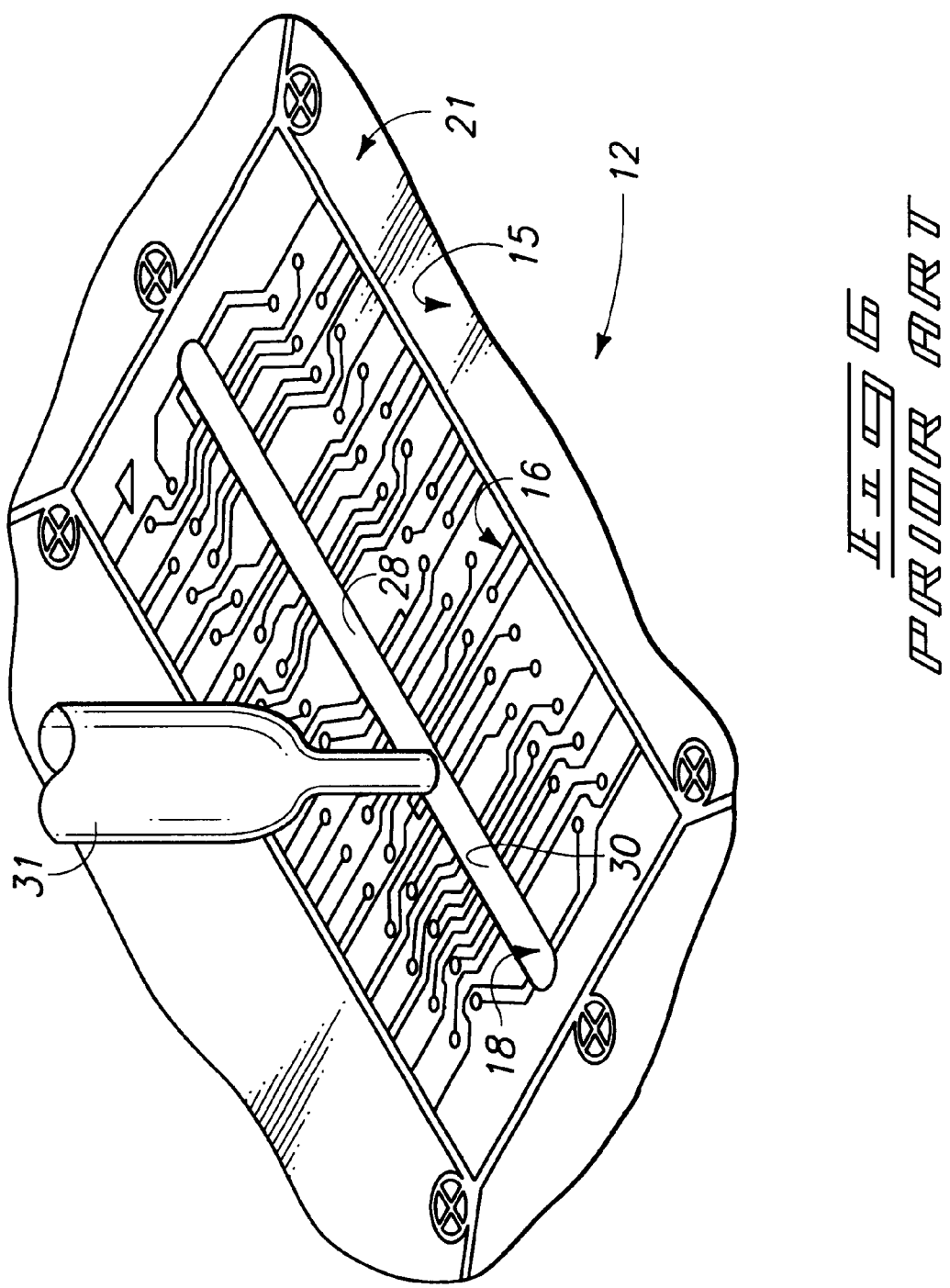
FIG. 6 is a view of the assembly of FIGS. 2–4, shown at a prior art processing step subsequent to that of FIG. 5, and in a view corresponding to that of FIG. 2.
Figure 7:
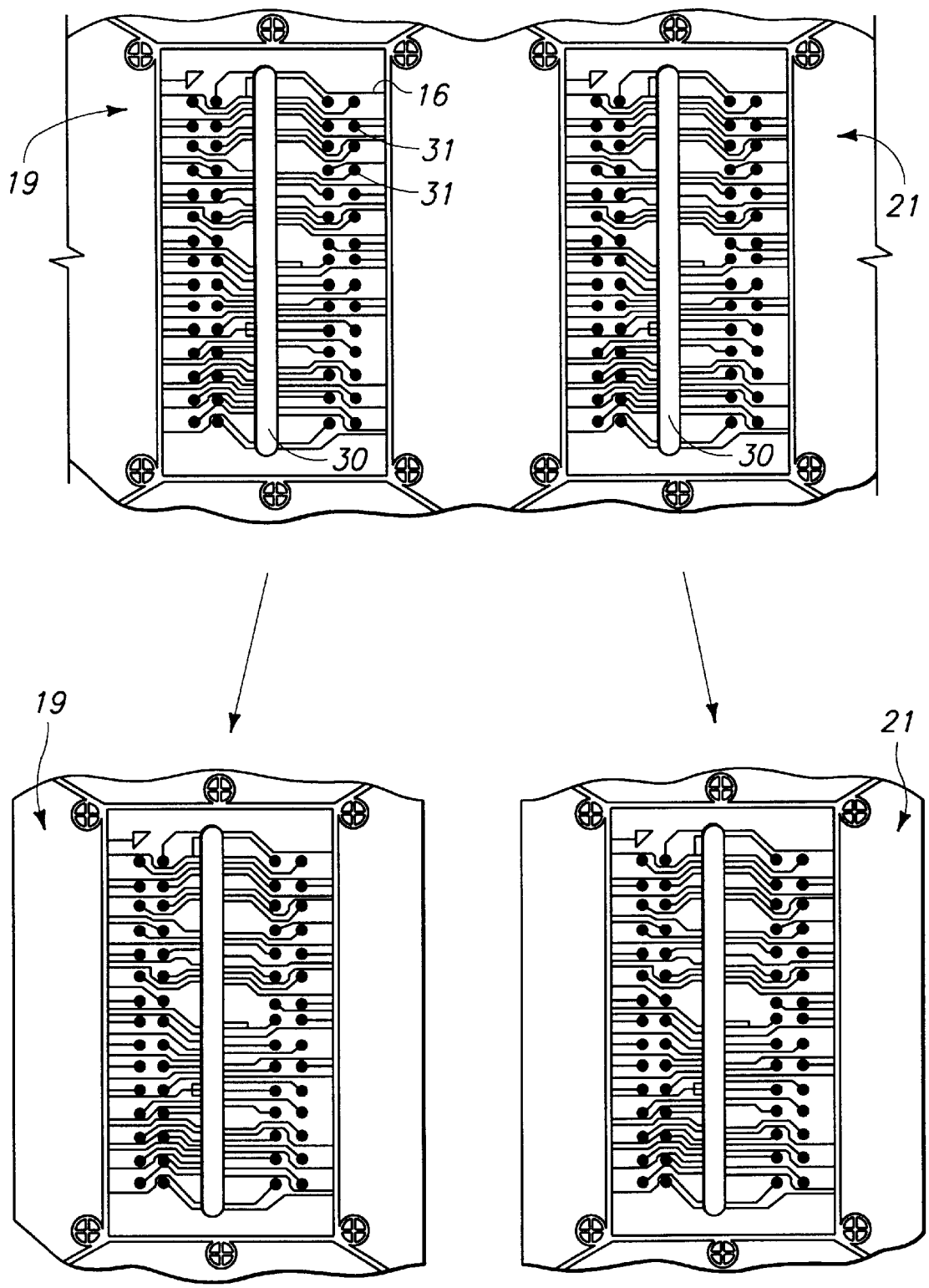
FIG. 7 is a view of a portion of the FIG. 1 assembly shown at a prior art processing step subsequent to that of FIG. 6.

Although only a single circuit pattern unit is shown on the material 12b of FIG. 8, it is to be understood that material 12b can, like the material 12 of FIG. 1, comprise a plurality of circuit pattern units formed thereon (the plurality of circuit pattern units of FIG. 1 are labeled as 19, 21 and 23). Accordingly, the circuitry of FIG. 8 can be a single unit along an insulative material which comprises a plurality of separate units.

Die 14b has a pair of opposing edges 50 and 52 (FIG. 9). In the shown embodiment, such edges extend outwardly beyond edges of strips 20b, and accordingly extend beyond ends of the channel corresponding to gap 26b.

Wire bonds 28b (only some of which are labeled) extend through slit 18b and gap 26b to connect circuitry 16b with bonding pads (not shown) on die 14. Only a portion of the wire bonds is visible in FIG. 8 because an encapsulant 30b has been provided in slit 18b and gap 26b.

An injector 31b is provided to inject encapsulant 30b through slit 18b and into gap 26b, and to accordingly cover a surface of die 14b exposed through slit 18b, as well as to cover portions of wire bonds 28b extending within slit 18b and gap 26b.

In preferred aspects of the present invention, the encapsulant is radiation-curable. In such preferred aspects, suitable radiation for curing the encapsulant is provided at the ends of gap 26b. In the shown application of the present invention, the encapsulant is curable by light, and light having a suitable wavelength to cure the encapsulant is provided at the ends of gap 26b. More specifically, the embodiment of FIG. 8 is configured with a pair of light sources 60 and 62, and a pair of tubes 64 and 66 extending from the light sources to direct light from the sources to the ends of gap 26b. Sources 60 and 62 can comprise, for example, lamps which generate light having a suitable wavelength to cure the encapsulant, and tubes 64 and 66 can comprise fiber optic tubes which direct the light to the ends 54 and 56 of gap 26b. It is noted that the ends 54 and 56 of gap 26b are proximate edges 50 and 52 (shown in FIG. 9) of die 14B. Accordingly, the radiation directed to ends 54 and 56 is directed over edges 50 and 52 of die 14b.

Although the embodiment described in reference to FIG. 8 utilizes a pair of radiation sources (60 and 62), it is to be understood that a single radiation source could be utilized, and tubes 64 and 66 can be utilized to direct radiation from the single source to the respective ends 54 and 56 of gap 26b.

Encapsulant 30b is flowed through injector 31b and into gap 26b. FIG. 9 is a cross-sectional top view having a same orientation as the view of prior art FIG. 4 and illustrating assembly 10b to illustrate encapsulant 30b within gap 26b. Encapsulant 30b comprises a liquid portion in the center of gap 26b and solid portions at the ends 54 and 56 of gap 26b. The solid portions form dams 70 and 72. Such dams are formed as encapsulant 30b is flowed into gap 26b by directing radiation from sources 60 and 62 to ends 54 and 56 of gap 26b. The radiation cures at least the portions of encapsulant 30b proximate ends 54 and 56 to form dams 70 and 72.

Dams 70 and 72 impede non-cured "liquid" encapsulant 30b from flowing beyond edges 50 and 52 of die 14b. The proportion of encapsulant 26b cured to form dams 70 and 72, relative to the proportion of encapsulant 30b which remains a liquid, can be varied by modifying an intensity of the radiation projected from sources 60 and 62, as well as by modifying a length of gap 26b. In the shown embodiment, only a portion of radiation-curable material 30b within gap 26b is cured by radiation projected over edges 50 and 52 from tubes 64 and 66. However, it is to be understood that in alternative embodiments a predominate portion, or even all, of encapsulant 30b within gap 26b can be cured by radiation projected from sources 60 and 62 and through tubes 64 and 66.

Tubes 64 and 66 can be oriented to project radiation substantially parallel with an upper surface of die 14b. The radiation projected from tube 64 and 66 will thus be directed into gap 26b, but not through slit 18b. Alternatively, tubes 64 and 66 can be oriented to direct the radiation through the ends of gap 26b and upwardly out of slit 18b. The radiation will then be directed through slit 18b during formation of dams 70 and 72.

A number of radiation curable encapsulants can be utilized in methods of the present invention. Among such encapsulants are, for example, encapsulants curable by light having one or more ultraviolet wavelengths. An exemplary encapsulant curable by light having ultraviolet wavelengths is CIBATOOL 5L5530 HT™.

It is noted that although the invention is described above as an embodiment utilizing two fiber optic tubes, the invention encompasses other embodiments (not shown) wherein more than two fiber optic tubes are utilized, or wherein only one fiber optic tube is utilized. In an embodiment wherein only one fiber optic tube is utilized, a first dam can be formed at an end of gap 26b by conventional methods, and a second dam formed by utilizing a radiation-curable encapsulant in accordance with methodology of the present invention. Alternate ways of directing radiant energy to these and other locations are, of course, contemplated.

In the embodiment of FIGS. 8 and 9, dams 70 and 72 are formed, and subsequently additional encapsulant 30b is provided to substantially fill gap 26b and slit 18b. The liquid encapsulant within slit 18b and gap 26b can be subsequently cured by radiation projected downwardly into slit 18b as shown in FIG. 10 (wherein the radiation is labeled as 80).

After encapsulant 30b is cured, assembly 10 can be subjected to additional processing, such as that described above with reference to FIG. 7, to form and singulate individual die packages from assembly 10b.

An alternative embodiment of the present invention is described with reference to FIG. 11. In referring to FIG. 11, similar numbering will be utilized which was used above in describing FIG. 8, with the suffix "c" utilized to indicate structures corresponding to FIG. 11. The embodiment of FIG. 11 differs from that of FIG. 8 in that tubes 64 and 66 are replaced with masking structures 90 and 92. Structures 90 and 92 have orifices 94 and 96 extending therethrough. In the shown embodiment, only one orifice is shown in each of structures 90 and 92, however, it is to be understood that the invention comprises other embodiments (not shown) wherein more than one orifice is provided in one or both of structures 90 and 92. Radiation from sources 60c and 62c is blocked by the material of structures 90 and 92, and penetrates through orifices 94 and 96. Orifices 94 and 96 are aligned with ends 54c and 56c of gap 26c, and accordingly align radiation with such ends of gap 26c. The radiation can then shine on radiation-curable encapsulant within gap 26c to form dams 70c and 72c.

In the shown embodiment, structures 90 and 92 comprise plates of a material substantially impervious to the radiation from sources 60c and 62c. If the radiation from sources 60c and 62c comprises light, the material of plates 90 and 92 can comprise, for example, an opaque material, such as, for example, metal. If the radiation from sources 60c and 62c comprise an ultraviolet light, and if the encapsulant provided within gap 26c is cured by exposure to ultraviolet light, plates 90 and 92 can comprise, for example, a plastic material configured to block the ultraviolet light.

After dams are formed by the embodiment of FIG. 11, subsequent processing, such as that described in FIG. 10, can be utilized to cure additional encapsulant provided within gap 26c and slit 18c. Further, substrate 12c can be subjected to additional die-package forming steps and one or more singulation processes to separate individual circuit packages from one another.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
providing an insulative substrate having a pair of opposing surfaces and an opening extending therethrough, the opening extending from one of the opposing surfaces to an other of the opposing surfaces;
providing a semiconductive-material-comprising die adjacent said one of the opposing surfaces of the insulative substrate and having an upper surface exposed through the opening in the insulative substrate, the die having an edge, a gap being between the die and the insulative substrate and being exposed through the opening;
flowing a liquid radiation-curable material through the opening and into the gap; and
directing radiation from beside the die substantially parallel to the upper surface and over the edge to effectively cure at least a portion of the radiation-curable material within the gap and thus form a dam which impedes non-cured radiation-curable material from flowing beyond the edge, and wherein the dam is formed during the flowing of the liquid radiation-curable material.

2. The method of claim 1 wherein the radiation is not directed through the opening during the forming of the dam.

3. The method of claim 1 wherein only a portion of the radiation-curable material within the gap is cured by the radiation which is directed over the edge.

4. The method of claim 1 wherein the radiation-curable material is cured by exposure to ultraviolet light and wherein the directed radiation comprises ultraviolet light.

5. The method of claim 1 wherein the radiation comprises light and is directed through at least one fiber optic tube to over the edge.

6. The method of claim 1 wherein the radiation comprises light and wherein the radiation is directed to over the edge with a plate comprising a material substantially impervious to the light and having at least one orifice therethrough.

7. The method of claim 1 wherein the radiation-curable material is cured by exposure to ultraviolet light, and wherein the light is directed through at least one fiber optic tube to over the edge.

8. The method of claim 1 wherein the radiation-curable material is cured by exposure to ultraviolet light, and wherein the light is directed through at least one fiber optic tube to over the edge; the method further comprising, after forming the dam and providing a layer of the radiation-curable material within the gap, directing ultraviolet light through the opening to cure at least some of the radiation-curable material within the gap.

9. The method of claim 1 wherein the radiation comprises light and wherein the radiation is directed to over the edge with a plate comprising a material substantially impervious to the light and having at least one orifice therethrough; the method further comprising, after forming the dam and providing a layer of the radiation-curable material within the gap, directing ultraviolet light through the opening to cure at least some of the radiation-curable material within the gap.

10. A method of forming a die package, comprising:
providing an insulative substrate having a slit extending therethrough, the substrate comprising an underside and an opposing topside;
providing circuitry being over the topside of the insulative substrate;
providing a semiconductive-material-comprising die beneath the underside of the insulative substrate and having a surface exposed through the slit in the insulative substrate, there being a gap between the die and the underside of the insulative substrate, the die having an edge;
injecting a radiation-curable material through the slit and into the gap; and
utilizing a discrete masking structure for directing radiation substantially parallel to the surface of the die and from over the edge to the gap to effectively cure at least a portion of the radiation-curable material within the gap and thus form a dam which impedes non-cured radiation-curable material from flowing beyond the edge, and wherein the discrete masking structure is separate from the insulative substrate and die.

11. The method of claim 10 further comprising, before injecting the radiation-curable material, providing electrical connections extending from the circuitry, through the slit, and to the surface of the die.

12. The method of claim 10 wherein the radiation-curable material is cured by exposure to ultraviolet light.

13. The method of claim 10 wherein the radiation comprises light and is directed through at least one fiber optic tube to over the edge.

14. The method of claim 10 wherein the radiation comprises light and wherein the radiation is directed over the edge with the discrete masking structure which comprises a material substantially impervious to the light and having at least one orifice extending therethrough.

15. The method of claim 10 wherein the radiation-curable material is cured by exposure to ultraviolet light, and wherein the light is directed over the edge with at least one fiber optic tube.

16. The method of claim 10 wherein the radiation-curable material is cured by exposure to ultraviolet light, and wherein the light is directed through at least one fiber optic tube to over the edge; the method further comprising, after forming the dam and providing a layer of the radiation-curable material within the gap, directing ultraviolet light through the slit to cure at least some of the radiation-curable material within the gap.

17. The method of claim 10 wherein the radiation comprises light; the method further comprising, after forming the dam and providing a layer of the radiation-curable material within the gap, directing ultraviolet light through the slit to cure at least some of the radiation-curable material within the gap.

18. The method of claim 10 wherein the radiation is not directed through the slit during the forming of the dam.

19. The method of claim 10 wherein:
the die is adhered to the underside of the insulative substrate with a pair of adhesive spacers;
the adhesive spacers extend along the underside of the insulative substrate along opposing sides of the slit and define the gap as a channel between them;
the die has a pair of opposing ends, one of the ends being said edge and the other of the ends being an other edge; and
radiation is directed over each of the edges to cure radiation-curable material proximate the edges and thus form dams of cured radiation-curable material which impede non-cured radiation-curable material from flowing beyond the ends of the die.

20. The method of claim 19 wherein the radiation comprises light which is directed through a first fiber optic tube to over said edge and is directed through a second fiber optic tube to over the other edge.

21. The method of claim 20 wherein the radiation is not directed through the slit during the forming of the dams.

22. A method of forming a die package, comprising:
providing an insulative substrate having an underside and an opposing topside, circuitry being over the topside of the insulative substrate and a slit extending through the insulative substrate, the slit having a periphery bounded by a pair of opposing ends and a pair of opposing sidewalls;
providing a semiconductive-material-comprising die beneath the underside of the insulative substrate and having a surface exposed through the slit in the insulative substrate, the die extending to beyond the ends and sidewalls of the slit periphery;
providing a pair of spacers between the die and the insulative substrate, one of the pair of spacers being proximate one of the sidewalls of the slit periphery and an other of the spacers being proximate an other of the sidewalls of the slit periphery, the spacers spacing the die from the insulative substrate to define a gap between an upper surface of the die and the underside of the insulative substrate, the die having a pair of end edges and the gap extending from proximate one of the end edges to proximate the other of the end edges;
injecting a radiation-curable material through the slit and into the gap; and
directing radiation substantially parallel to the surface of the die and over the end edges to cure the radiation-curable material proximate the end edges and thus form a pair of dams which impede non-cured radiation-curable material from flowing beyond the end edges, wherein the pair of dams are formed during the injecting of the radiation-curable material.

23. The method of claim 22 further comprising, before injecting the radiation-curable material, providing electrical connections extending from the circuitry, through the slit and to the surface of the die.

24. The method of claim 22 further comprising:
before injecting the radiation-curable material, providing electrical connections extending from the circuitry, through the slit and to the surface of the die;
after forming the dams, at least substantially filling the gap and slit with the radiation-curable material; and
exposing at least some of the radiation-curable material within the gap and slit to radiation to cure the radiation-curable material.

25. The method of claim 22 wherein the radiation-curable material is cured by exposure to ultraviolet light.

26. The method of claim 22 wherein the radiation comprises light; the light being directed through a first fiber optic tube to over one of the end edges of the die and being directed through a second fiber optic tube to over the other of the end edges of the die.

27. The method of claim 22 wherein the radiation comprises light and wherein the radiation is directed to over the end edges with at least one plate comprising a material substantially impervious to the light and having at least one orifice extending therethrough.

28. The method of claim 22 wherein the radiation-curable material is cured by exposure to ultraviolet light, and wherein the light is directed through fiber optic tubes to over the end edges; the method further comprising, after forming the dam and providing a layer of the radiation-curable material within the gap, directing ultraviolet light through the slit to cure at least some of the radiation-curable material within the gap.

29. The method of claim 22 wherein the radiation comprises light and wherein the radiation is directed to over the end edges with at least one plate comprising a material substantially impervious to the light and having at least one orifice extending therethrough; the method further comprising, after forming the dam and providing a layer of the radiation-curable material within the gap, directing ultraviolet light through the slit to cure at least some of the radiation-curable material within the gap.

30. The method of claim 22 wherein the radiation is not directed through the slit during the forming of the dam.

31. The method of claim 22 wherein the insulative substrate comprises a plurality of slits extending therethrough and at least one repeating pattern of circuitry associated with the slits, wherein a plurality of dies are provided beneath the underside of the insulative substrate and in a one-to-one correspondence with the slits; the method further comprising, after forming the dams, cutting the insulative substrate to form singulated die packages, at least some of the singulated die packages comprising a single slit and a single die associated with the single slit.

32. A semiconductor processing method, comprising:
providing an insulative substrate having an underside and an opposing topside, and a slit extending through the insulative substrate;
providing circuitry over the topside of the insulative substrate;
providing a semiconductor-material-comprising die beneath the underside of the insulative substrate and having a surface exposed through the slit in the insulative substrate, the surface of the die spaced from the underside of the insulative substrate;
providing a radiation-curable material through the slit and allowing the radiation-curable material to flow over the surface of the die; and
while providing the radiation-curable material, directing radiation substantially parallel and coplanar to the flow of the radiation-curable material to cure at least a portion of the radiation-curable material and thus form a dam which impedes non-cured radiation cured curable material from flowing beyond the dam.

33. The method of claim 32 wherein the radiation is not provided through the slit during the forming of the dam.

34. The method of claim 32 wherein only a portion of the radiation-curable material over the surface of the die is cured by the radiation which is directed substantially parallel and coplanar to the flow of the radiation-curable material.

35. The method of claim 32 wherein the radiation-curable material is cured by exposure to ultraviolet light and wherein the directed radiation comprises ultraviolet light.

36. The method of claim 32 wherein the radiation comprises light and is directed through at least one fiber optic tube.

37. The method of claim 32 wherein the radiation comprises light and wherein the radiation is directed with a plate comprising a material substantially impervious to the light and having at least one orifice therethrough.

38. The method of claim 32 wherein the radiation-curable material is cured by exposure to ultraviolet light, and wherein the light is directed through at least one fiber optic tube to be substantially parallel and coplanar to the flow of the radiation-curable material.

39. The method of claim 32 further comprising, before providing the radiation-curable material, providing electrical connections extending from the circuitry, through the slit and to the surface of the die.

40. The method of claim 32 wherein the radiation comprises light; the method further comprising, after forming the dam and providing a layer of the radiation-curable material within the slit, directing ultraviolet light through the slit to cure at least some of the radiation-curable material within the slit.

* * * * *

UNITED STATES PATENT AND TRADEMARK OFFICE
CERTIFICATE OF CORRECTION

PATENT NO.     : 6,379,991 B2                                          Page 1 of 1
DATED          : April 30, 2002
INVENTOR(S)    : Ford B. Grigg et al.

It is certified that error appears in the above-identified patent and that said Letters Patent is hereby corrected as shown below:

Column 3,
Line 44, replace "with the suffix "a" utilized to indicate structures" with -- with the suffix "b" utilized to indicate structures --

Signed and Sealed this

Twenty-eighth Day of January, 2003

JAMES E. ROGAN
*Director of the United States Patent and Trademark Office*